(12) United States Patent
Okazaki et al.

(10) Patent No.: US 10,617,030 B2
(45) Date of Patent: Apr. 7, 2020

(54) CASING SEPARATION MECHANISM

(71) Applicant: MEIDENSHA CORPORATION, Tokyo (JP)

(72) Inventors: Nobuo Okazaki, Hachioji (JP); Akihiko Kodama, Ota (JP); Makoto Miwa, Haibara-gun (JP); Shigenori Ikeda, Makinohara (JP); Yoshio Kijima, Setagaya-ku (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 16/303,245

(22) PCT Filed: Feb. 24, 2017

(86) PCT No.: PCT/JP2017/007199
§ 371 (c)(1),
(2) Date: Nov. 20, 2018

(87) PCT Pub. No.: WO2017/203771
PCT Pub. Date: Nov. 30, 2017

(65) Prior Publication Data
US 2019/0208661 A1    Jul. 4, 2019

(30) Foreign Application Priority Data

May 24, 2016  (JP) ................................. 2016-103785
May 24, 2016  (JP) ................................. 2016-103787

(51) Int. Cl.
*H05K 7/18*    (2006.01)
*H05K 5/02*    (2006.01)

(52) U.S. Cl.
CPC ........... *H05K 7/183* (2013.01); *H05K 5/0204* (2013.01); *H05K 5/0234* (2013.01); *H05K 7/18* (2013.01)

(58) Field of Classification Search
CPC ......... A47B 53/02; A47B 46/00; A47B 77/10; A47B 87/005; A47B 87/007;
(Continued)

(56) References Cited

U.S. PATENT DOCUMENTS 75,579 A * 3/1868 Roux ..................... A47B 53/02
                                                            312/199
976,339 A * 11/1910 Billburg ................. A47B 53/02
                                                            312/200
(Continued)

FOREIGN PATENT DOCUMENTS

JP    58-195476 U    12/1983
JP    63-164278 U    10/1988
(Continued)

*Primary Examiner* — Andrew M Roersma
(74) *Attorney, Agent, or Firm* — Foley & Lardner LLP

(57) ABSTRACT

When moving casing accommodating electronic equipment for maintenance of electronic equipment, stability of casing is maintained and safety is ensured. Casing separation mechanism 1 separates and connects a pair of casings 2a, 2b. A pair of rail portions 11 are set in bottom frame 21a of one casing 2a with rail portions 11 overhanging from frame 21a. A pair of rail portions 12 extend from one ends of rail portions 11 and retract into rail portions 11 so as to be able to stop during movement of rail portions 12 by rail movement mechanism. A pair of rail portions 13 are set in bottom frame 21b of other casing 2b with rail portions 13 overhanging from frame 21b, and extend from one ends of rail portions 12 and retract into rail portions 12 so as to be able to stop during movement of rail portions 13 by rail movement mechanism.

13 Claims, 6 Drawing Sheets

(58) Field of Classification Search
CPC .... A47B 87/008; A47B 88/42; H05K 5/0021; H05K 5/0204; H05K 5/0217; H05K 7/183; H05K 7/18; H05K 7/1485; H05K 7/1488
USPC ....... 312/198, 199, 200, 201, 271, 273, 274; 361/724–727
See application file for complete search history.

(56) References Cited

U.S. PATENT DOCUMENTS

| | | | | |
|---|---|---|---|---|
| 3,335,326 | A * | 8/1967 | Bonin | H01R 35/02 361/827 |
| 4,744,001 | A * | 5/1988 | Krafft | H02B 11/127 200/50.26 |
| 5,443,312 | A * | 8/1995 | Schluter | H02B 1/36 312/201 |
| 5,459,293 | A * | 10/1995 | Hodkin | H02B 11/12 200/50.26 |
| 6,076,906 | A * | 6/2000 | Royal | A47B 46/00 312/223.1 |
| 6,318,824 | B1 * | 11/2001 | LaGrotta | E05D 3/022 312/322 |
| 7,042,732 | B2 * | 5/2006 | Hung | H05K 7/1421 312/223.1 |
| 7,277,273 | B2 * | 10/2007 | Smith | H05K 7/1488 211/26 |
| 7,535,717 | B2 * | 5/2009 | Lai | G06F 1/181 361/727 |
| 2012/0194049 | A1 * | 8/2012 | Cook | H05K 7/1488 312/236 |
| 2014/0260731 | A1 * | 9/2014 | Devanand | F16H 25/20 74/89.23 |
| 2015/0008813 | A1 * | 1/2015 | Braun | B65F 1/1436 312/334.1 |
| 2016/0135323 | A1 * | 5/2016 | Haroun | H05K 7/1485 361/679.53 |

FOREIGN PATENT DOCUMENTS

| | | |
|---|---|---|
| JP | 7-307586 A | 11/1995 |
| JP | 10-242657 A | 9/1998 |
| JP | 11-145621 A | 5/1999 |
| JP | 11-145631 A | 5/1999 |
| JP | 2002-176275 A | 6/2002 |
| JP | 2002-176277 A | 6/2002 |

* cited by examiner

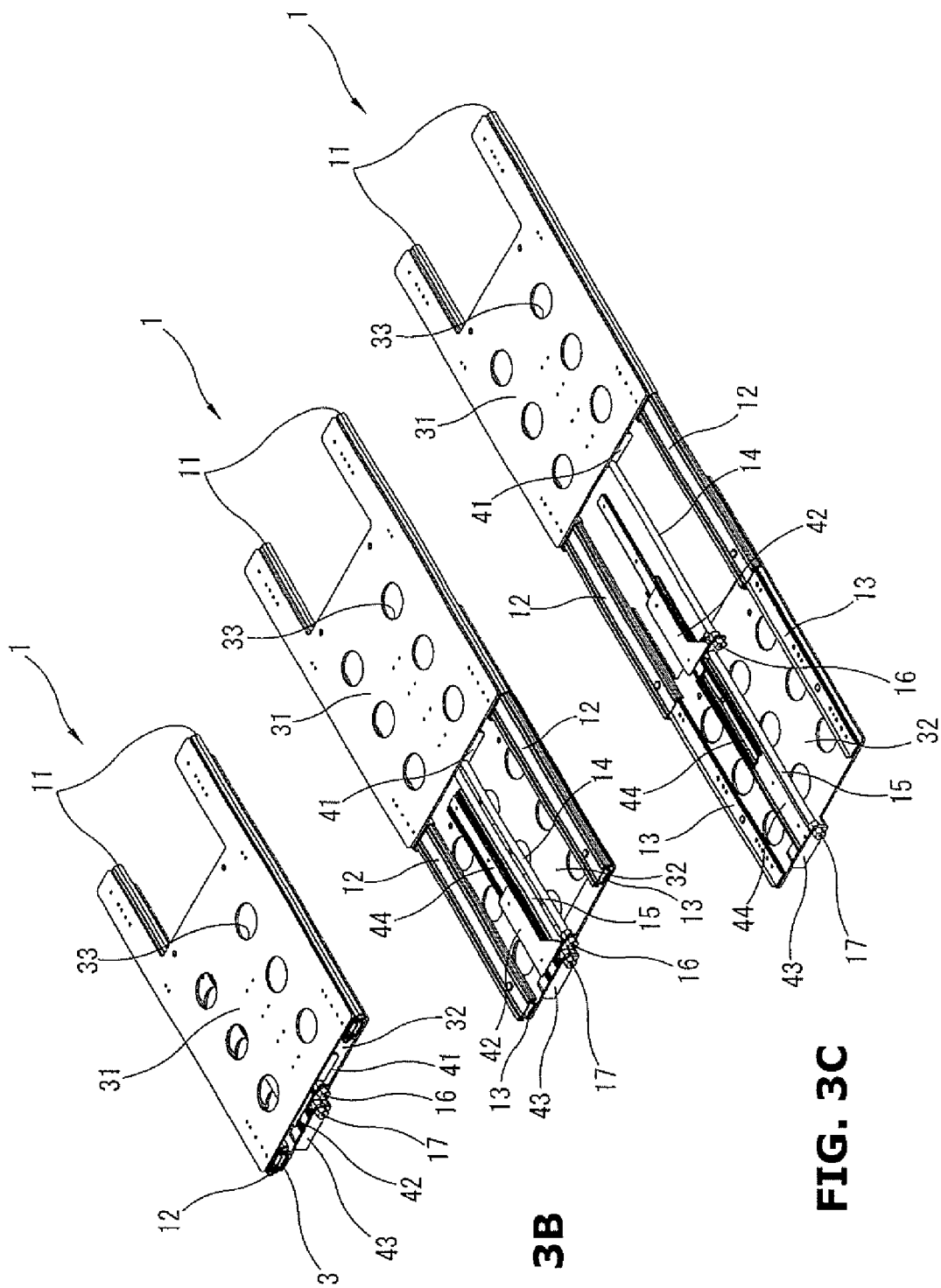

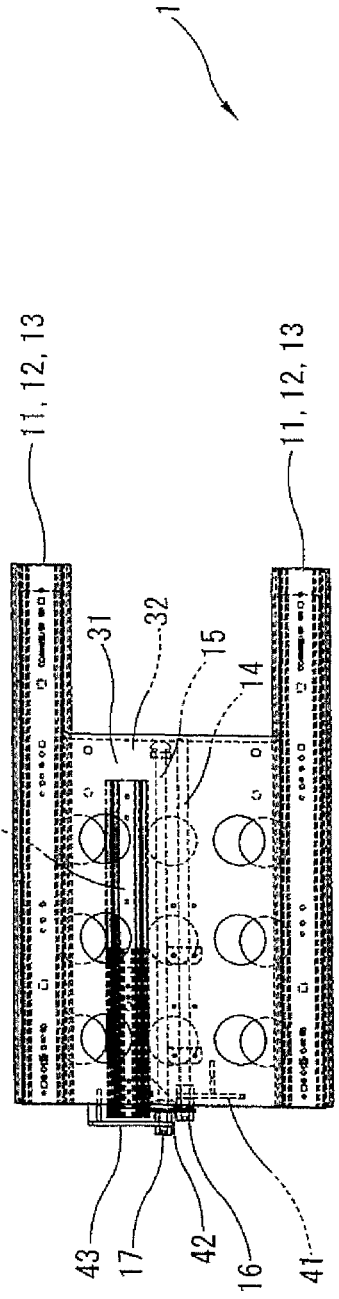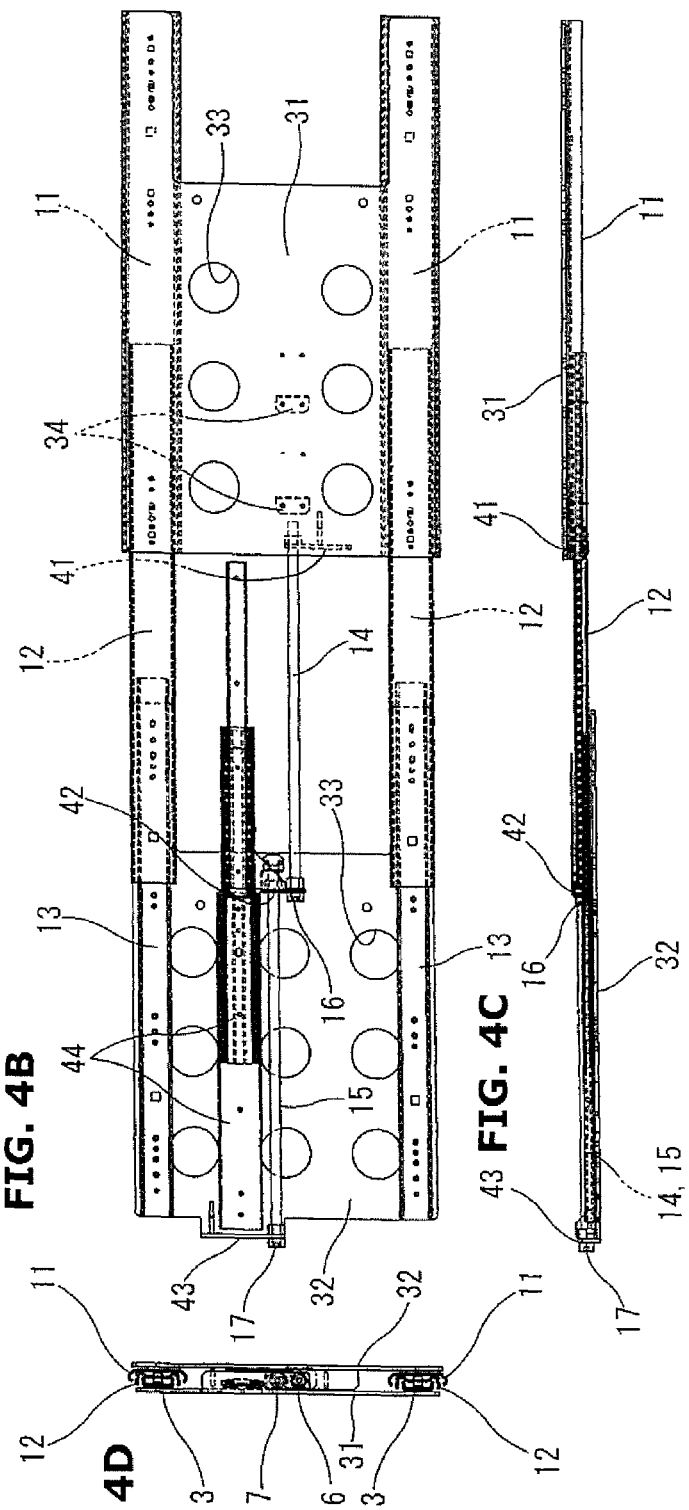

CASING SEPARATION MECHANISM

TECHNICAL FIELD

The present invention relates to a separation mechanism that allows separation and connection of a pair of casings that accommodate therein electronic equipment.

BACKGROUND ART

As a casing accommodating therein the electronic equipment, casings are disclosed in, for instance, Patent Documents 1 to 3.

The casing disclosed in Patent Document 1 is structured to be able to draw the electronic equipment from a casing body and carry out maintenance of the electronic equipment. The casings disclosed in Patent Documents 2 and 3 are structured to be able to, by moving a casing body from a wall surface of a building, secure a maintenance space between the casing body and the building wall surface.

CITATION LIST

Patent Document

Patent Document 1: Japanese Unexamined Patent Application Publication No. H07-307586
Patent Document 2: Japanese Unexamined Patent Application Publication No. H11-145631
Patent Document 3: Japanese Unexamined Patent Application Publication No. 2002-176277

SUMMARY OF THE INVENTION

In a case of the related art casings, in a state in which the electronic equipment is mounted in the casing body on a large scale, when moving the casing body for the maintenance of the electronic equipment, the casing body might become unstable then adequate safety cannot be ensured.

Further, in the case of the related art casings, in the state in which the electronic equipment is mounted in the casing body on a large scale, when moving the casing body for the maintenance of the electronic equipment, a smooth movement of the casing body in a stable state might become impossible by being affected by inclination or distortion (or warp) of a floor of the building.

Therefore, according to one aspect of the present invention, a casing separation mechanism of a pair of casings that accommodate therein electronic equipment, comprises: a pair of first rail portions which are arranged parallel to each other in a frame of one casing of the pair of casings with the first rail portions overhanging from the frame of the one casing; a pair of second rail portions which are set in a frame of the other casing of the pair of casings with the second rail portions overhanging from the frame of the other casing and which are accommodated in the first rail portions so as to be able to extend from one ends of the pair of first rail portions; and a rail movement mechanism which extends the second rail portions from the one ends of the first rail portions and accommodates the second rail portions in the first rail portions so as to be able to stop the second rail portions during progress of movement of the second rail portions.

According to another aspect of the present invention, the casing separation mechanism further comprises: a pair of third rail portions accommodated in the first rail portions so as to be able to extend from the one ends of the pair of first rail portions, and the rail movement mechanism extends the second rail portions from one ends of the pair of third rail portions and accommodates the second rail portions in the third rail portions so as to be able to stop the second rail portions during progress of movement of the second rail portions.

According to a further aspect of the invention, the rail movement mechanism has: a first parallel connecting member that is set in the frame of the other casing and connects the pair of second rail portions parallel to each other; and a first drive mechanism that is provided at the first parallel connecting member, extends the second rail portions from the one ends of the first rail portions and accommodates the second rail portions in the first rail portions so as to be able to stop the second rail portions during progress of movement of the second rail portions.

According to a further aspect of the invention, the first drive mechanism has: a first rotation shaft which is disposed between the pair of second rail portions; a first supporting portion into which the first rotation shaft is screwed; and a second supporting portion which is provided at a portion on a front side of the first parallel connecting member and rotatably supports the first rotation shaft.

According to a further aspect of the invention, the rail movement mechanism has: a second parallel connecting member that connects the pair of first rail portions parallel to each other; and a second drive mechanism that is provided at the second parallel connecting member, extends the third rail portions from the one ends of the first rail portions and accommodates the third rail portions in the first rail portions so as to be able to stop the third rail portions during progress of movement of the third rail portions.

According to a further aspect of the invention, the second drive mechanism has: a second rotation shaft which is disposed between the pair of third rail portions and rotatably supported by the first supporting portion; and a third supporting portion which is provided at a portion on a front side of the second parallel connecting member and into which the second rotation shaft is screwed.

According to a further aspect of the invention, the casing separation mechanism further comprises: a guide portion that guides the first supporting portion parallel to the pair of second rail portions.

According to a further aspect of the invention, at least one of the first rotation shaft and the second rotation shaft is provided, at a front end portion thereof, with a tool receiving portion into which one end portion of a rotation shaft of a tool that rotates at least the one of the first rotation shaft and the second rotation shaft is fitted.

According to a further aspect of the invention, the frame of the other casing has wheels.

According to a further aspect of the invention, the casing separation mechanism further comprises: a first tilt absorption member that absorbs tilt of the first rail portions with the first tilt absorption member interposed between the frame of the one casing and the first rail portion; and a second tilt absorption member that absorbs tilt of the second rail portions with the second tilt absorption member interposed between the frame of the other casing and the second rail portion.

According to a further aspect of the invention, the casing separation mechanism is provided in at least one of a bottom frame and a top frame of the pair of casings.

According to the present invention described above, when moving the casing accommodating therein the electronic equipment for the maintenance of the electronic equipment, stability of the casing can be maintained then the safety can be ensured.

Further, in the present invention, the casing separation mechanism has the first and second tilt absorption members. Therefore, in addition to the above effect, when moving the casing accommodating therein the electronic equipment for the maintenance of the electronic equipment, the smooth movement of the casing in a stable state can be possible.

BRIEF DESCRIPTION OF THE DRAWINGS

FIG. 3A is a perspective view of the casing separation mechanism, showing a state in which a second rail portion and a third rail portion are accommodated or retracted.

FIG. 3B is a perspective view of the casing separation mechanism, showing a state in which the third rail portion is extended.

FIG. 3C is a perspective view of the casing separation mechanism, showing a state in which the second rail portion and the third rail portion are extended.

FIG. 4A is a plan view of the casing separation mechanism, showing the state in which the second rail portion and the third rail portion are accommodated or retracted.

FIG. 4B is a plan view of the casing separation mechanism, showing the state in which the second rail portion and the third rail portion are extended.

FIG. 4C is a side view of the casing separation mechanism.

FIG. 4D is a front view of the casing separation mechanism.

EMBODIMENTS FOR CARRYING OUT THE INVENTION

Embodiments of the present invention will be explained below with reference to the drawings.

First Embodiment

Figure 1:
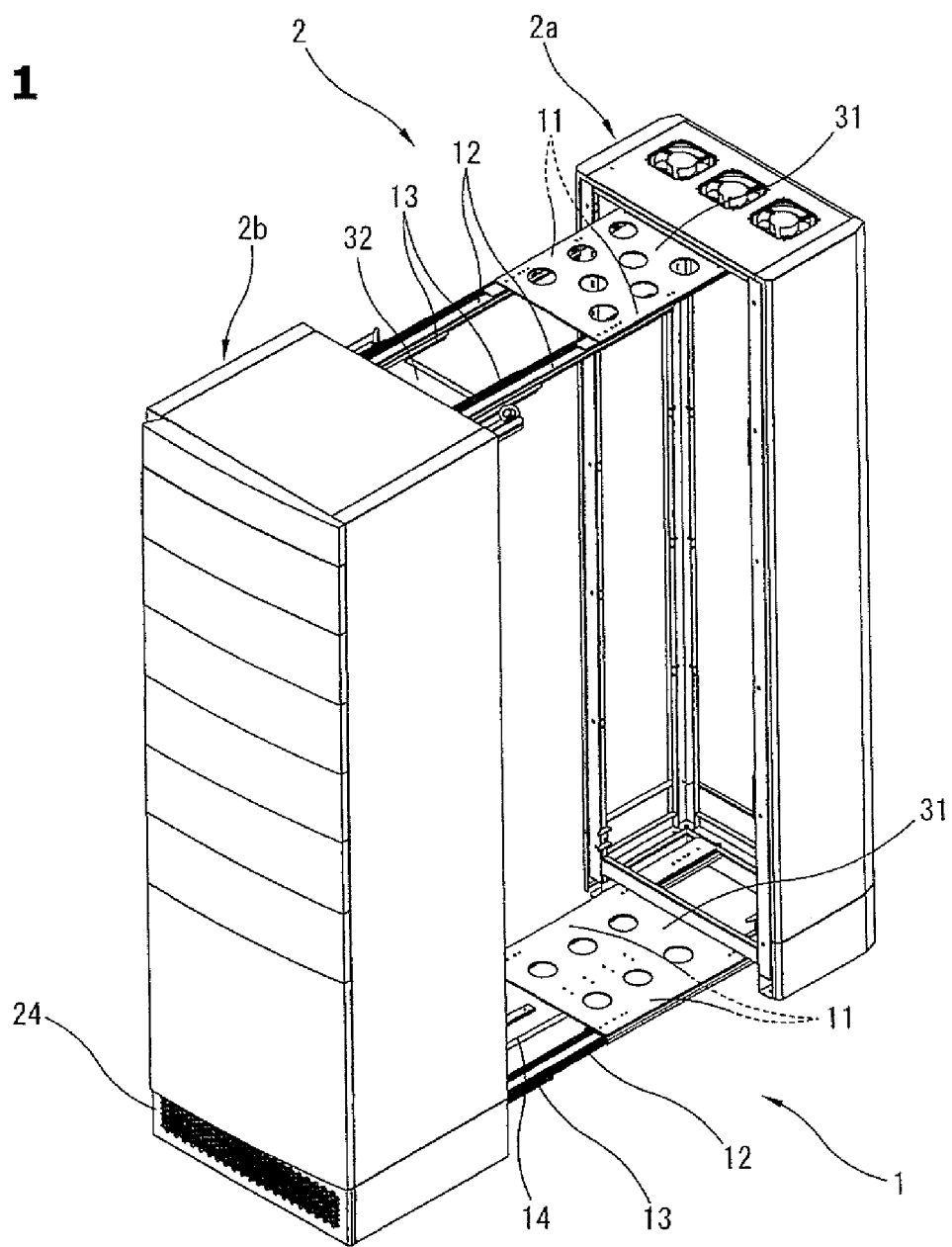
FIG. 1 is a perspective view of a casing having a casing separation mechanism, according to a first embodiment of the present invention.

A casing separation mechanism 1 of the present invention shown in FIG. 1 is a mechanism that separates and connects one casing 2a and the other casing 2b of a pair of casings 2 that enclose or accommodate therein electronic equipment (not shown).

Figure 2:
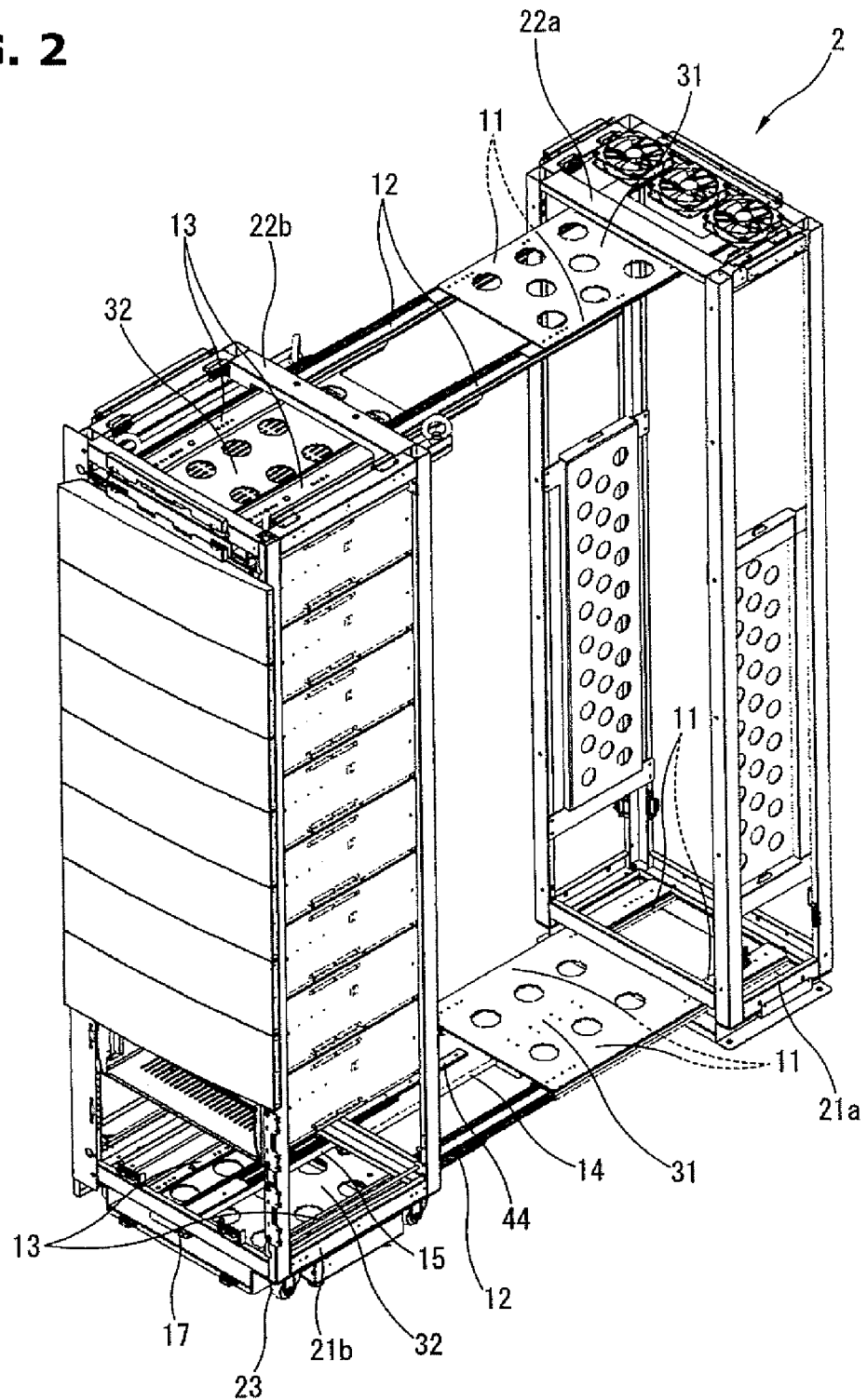
FIG. 2 is a perspective view of the casing with an upper cover, side covers and a front cover positioned close to a bottom of the casing being removed.

As shown in FIG. 2, the casing separation mechanism 1 is set in frames of the casings 2a and 2b, more specifically, bottom frames 21a and 21b and top frames 22a and 22b of the casings 2a and 2b.

The casing separation mechanism 1 set in the bottom frames 21a and 21b has a pair of rail portions 11, a pair of rail portions 12 and a pair of rail portions 13. The casing separation mechanism 1 further has a rail movement mechanism that extends the rail portion 12 and the rail portion 13 from one end of the rail portion 11 and from one end of the rail portion 12 respectively, and accommodates (or retracts) the rail portion 12 and the rail portion 13 in (or into) the rail portion 11 and in (or into) the rail portion 12 respectively.

The casing separation mechanism 1 set in the top frames 22a and 22b has a same structure as that of the casing separation mechanism 1 set in the bottom frames 21a and 21b except that the rail movement mechanism is not provided. Here, although the rail movement mechanism is provided in the bottom frames 21a and 21b, depending on a scale or sizes of the casings 2a and 2b, the rail movement mechanism is provided in either one or both of the top frames 22a and 22b and the bottom frames 21a and 21b.

(Example of Aspect of Rail Movement Mechanism)

The rail movement mechanism separates the casings 2a and 2b that are in a connecting state by extending the rail portion 12 from the one end of the rail portion 11.

The rail movement mechanism has a parallel connecting member 31 that connects or fixes the pair of rail portions 11 parallel and a drive mechanism (hereinafter, called a second drive mechanism), corresponding to a second drive mechanism of the present invention, which is provided at the parallel connecting member 31 and extends the rail portion 12 from the one end of the rail portion 11 and accommodates (or retracts) the rail portion 12 in (or into) the rail portion 11 so as to be able to stop the rail portion 12 during the progress of movement of the rail portion 12.

The rail movement mechanism further has a parallel connecting member 32 that connects or fixes the pair of rail portions 13 parallel and a drive mechanism (hereinafter, called a first drive mechanism), corresponding to a first drive mechanism of the present invention, which is provided at the parallel connecting member 32 and extends the rail portion 13 from the one end of the rail portion 12 and accommodates (or retracts) the rail portion 13 in (or into) the rail portion 12 so as to be able to stop the rail portion 13 during the progress of movement of the rail portion 13.

(Example of Aspect of First Drive Mechanism and Second Drive Mechanism)

The second drive mechanism has a rotation shaft 14 which is disposed between the pair of rail portions 12 and a supporting portion 41 which is provided at a portion on a front side of the parallel connecting member 31 and into which the rotation shaft 14 is screwed.

The first drive mechanism has a rotation shaft 15 which is disposed between the pair of rail portions 13, a supporting portion 42 which rotatably supports one end side of the rotation shaft 14 and into which the rotation shaft 15 is screwed and a supporting portion 43 which is provided at a portion on a front side of the parallel connecting member 32 and rotatably supports one end side of the rotation shaft 15.

As an aspect of the rotation shaft 14 and the rotation shaft 15, for instance, it is a bolt that is screwed into a nut that is applied to the supporting portion 41 and the supporting portion 42 as a bearing.

The rotation shaft 14 and the rotation shaft 15 are provided, at front end portions thereof, with tool receiving portions 16 and 17 respectively into which one end portion of a rotation shaft of a tool for rotating the rotation shaft 14 and the rotation shaft 15 is fitted.

As an aspect of the tool receiving portions 16 and 17, if a shape of the rotation shaft of the tool is a polygonal column (e.g. hexagonal column), it is a screw head having a polygonal hole (e.g. hexagonal hole) into which the rotation shaft of the tool is fitted. And, this screw head is fixed to each end portion of the rotation shaft 14 and the rotation shaft 15.

The supporting portion 41 and the supporting portion 42 each has the bearing to which each of the rotation shaft 14 and the rotation shaft 15 is fitted. As the bearing, for instance, it is the nut into which the bolt that is applied to the rotation shaft 14 and the rotation shaft 15 is screwed.

Here, the first drive mechanism and the second drive mechanism are not limited to the above aspects as long as the first drive mechanism and the second drive mechanism can move the rail portion 12 and the rail portion 13 forward and backward so as to be able to stop the rail portion 12 and the rail portion 13 during the progress of movement of the rail portion 12 and the rail portion 13. That is, as other aspects of the first drive mechanism and the second drive mechanism, instead of the rotation shaft 14 and the rotation shaft 15, for instance, an air cylinder and a hydraulic cylinder could be used. Each of these is one aspect of the first drive mechanism and the second drive mechanism of the present invention.

(Example of Aspect of Rail Portion 11, Rail Portion 12 and Rail Portion 13)

As shown in FIG. 2, the rail portions 11 are set in the bottom frame 21a of the one casing 2a of the pair of casings 2 with the pair of rail portions 11 overhanging from the bottom frame 21a.

Each of the rail portions 12 is structured to be able to extend from the one end of the rail portion 11 and retract into the rail portion 11 so as to be able to stop during the progress of movement of the rail portion 12 by the rail movement mechanism (by rotation of the rotation shaft 14).

The rail portions 13 are set in the bottom frame 21b of the other casing 2b of the pair of casings 2 with the pair of rail portions 13 overhanging from the bottom frame 21b. Further, each of the rail portions 13 is structured to be able to extend from the one end of the rail portion 12 and retract into the rail portion 12 so as to be able to stop during the progress of movement of the rail portion 13 by the rail movement mechanism (by rotation of the rotation shaft 15). Here, the bottom frame 21b is provided, at four corners on a lower surface thereof, with wheels 23.

The parallel connecting member 31 is positioned and secured on upper surfaces of the rail portions 11 so as to be accommodated in the other casing 2b when the pair of casings 2a and 2b are connected or joined together.

On the other hand, the parallel connecting member 32 is positioned and secured on lower surfaces of the rail portions 13 with the parallel connecting member 32 accommodated in the other casing 2b.

In a case where the casing separation mechanism 1 is set in the top frames 22a and 22b, as shown in FIG. 2, the rail portions 11 are set in the top frame 22a of the one casing 2a of the pair of casings 2 with the pair of rail portions 11 overhanging from the top frame 22a. On the other hand, the rail portions 13 are set in the top frame 22b of the other casing 2b of the pair of casings 2 with the pair of rail portions 13 overhanging from the top frame 22b.

(Example of Aspect of Parallel Connecting Member 31)

The parallel connecting member 31 is made of steel, and has a rectangular plate shape. A plurality of circular openings 33 are provided and arranged at a body of the parallel connecting member 31, thereby achieving weight reduction.

The supporting portion 41 of the second drive mechanism is fixed to the portion on the front side of the parallel connecting member 31 (in the present embodiment, a front portion on a lower surface side of the parallel connecting member 31).

The parallel connecting member 31 is provided, on the lower surface thereof, with horizontal supporting portions 34 that horizontally support the rotation shaft 14 when the rail portions 12 are accommodated in the rail portions 11.

A structure or configuration of the parallel connecting member 31 is not limited to the above as long as the parallel connecting member 31 can arrange the rail portions 11 parallel at regular intervals. That is, as other aspects of the parallel connecting member 31, for instance, an H-shaped rectangular plate structure, an oblong rectangular plate structure and a duckboard-like structure having a plurality of oblong rectangular plates could be used.

(Example of Aspect of Parallel Connecting Member 32)

The parallel connecting member 32 is also made of steel, and has a rectangular plate shape. Likewise, a plurality of circular openings 33 are provided and arranged at a body of the parallel connecting member 32, thereby achieving weight reduction.

The supporting portion 42 of the first drive mechanism is set above an upper surface of the parallel connecting member 32 so as to be able to move parallel to the pair of rail portions 13.

The supporting portion 43 of the first drive mechanism is fixed to the portion on the front side of the parallel connecting member 32 (in the present embodiment, a front portion on an upper surface side of the parallel connecting member 32).

Further, a guide portion 44 that guides the supporting portion 42 parallel to the pair of rail portions 13 is provided on or above the upper surface of the parallel connecting member 32.

A structure or configuration of the parallel connecting member 32 is not limited to the above as long as the parallel connecting member 32 can arrange the rail portions 13 parallel at regular intervals. That is, as other aspects of the parallel connecting member 32, for instance, an H-shaped rectangular plate structure, an oblong rectangular plate structure and a duckboard-like structure having a plurality of oblong rectangular plates could be used.

(Example of Movement of Casing Separation Mechanism 1)

Examples of the movement of the casing separation mechanism 1 will be explained with reference to FIGS. 1 to 4.

First, the movement of the casing separation mechanism 1 when separating the casing 2a and the casing 2b will be explained.

When the casing 2a and the casing 2b are in the connecting state, as shown in FIGS. 3A and 4A, the rail portions 12 are accommodated in the rail portions 11, and the rail portions 13 are accommodated in the rail portions 12. Here, when removing a bottom front cover 24 of the bottom frame 21b shown in FIG. 1, the tool receiving portions 16 and 17 of the rotation shaft 14 and the rotation shaft 15 are exposed from a front lower end portion of the bottom frame 21b as shown in FIG. 2.

Next, when fitting a tip end of the rotation shaft of the tool into the tool receiving portion 16 of the rotation shaft 14 shown in FIG. 3A and rotating the rotation shaft 14 in a counterclockwise direction, the rotation shaft 14 comes out of the supporting portion 41 to a front side of the supporting portion 41. At this time, as shown in FIG. 3B, the rail portions 12 are extended from front side end portions of the rail portions 11, and also, at the top frame 22a and 22b side, the rail portions 12 are extended from the one ends of the rail portions 11. By and according to this movement, the wheels 23 of the bottom frame 21b roll on a floor in a forward direction of the casing 2. Then, when a stopper of one end portion of the rotation shaft 14 contacts the supporting portion 41, the casing 2b is separate from the casing 2a in the forward direction of the casing 2 by a distance of the extension of the rail portion 12.

Next, when intending to secure a further space between the casing 2a and the casing 2b, the tip end of the rotation shaft of the tool is fitted into the tool receiving portion 17 of the rotation shaft 15, and the rotation shaft 15 is rotated in the counterclockwise direction. Then, the rotation shaft 15 comes out of the supporting portion 42 to a front side of the supporting portion 42. At this time, as shown in FIGS. 3C, 4B and 4C, the rail portions 13 are extended from front side end portions of the rail portions 12, and also, at the top frame 22a and 22b side, the rail portions 13 are extended from the one ends of the rail portions 12. By and according to this movement, the wheels 23 of the bottom frame 21b roll on the floor in the forward direction of the casing 2. Then, when a stopper of a back side end portion of the rotation shaft 15 contacts the supporting portion 42, the casing 2b is further separate from the casing 2a in the forward direction of the casing 2 by a distance of the extension of the rail portion 12 and the rail portion 13.

As described above, in a state in which the casing 2a and the casing 2b are separate from each other as shown in FIG. 1, a maintenance space is secured between the casing 2a and the casing 2b. Subsequently, for instance, a terminal block as an electronic component is accommodated in the casing 2a, and the electronic equipment (not shown) is accommodated in the casing 2b. Further, by carrying out wiring by an operator who interposes himself/herself between the casing 2a and the casing 2b, the terminal block and the electronic equipment are electrically connected to each other.

Next, the movement of the casing separation mechanism 1 when connecting the casing 2a and the casing 2b will be explained.

After completing carrying out the wiring, a connecting operation (a joining operation) of the casing 2a and the casing 2b is performed. That is, when fitting the tip end of the rotation shaft of the tool into the tool receiving portion 17, shown in FIGS. 3C, 4B and 4C, of the rotation shaft 15 and rotating the rotation shaft 15 in a clockwise direction, the rotation shaft 15 is retracted to a back side of the supporting portion 42. At this time, the rail portions 13 are retracted into the rail portions 12, and at the top frame 22a and 22b side, the rail portions 13 are retracted into the rail portions 12. By and according to this movement, the wheels 23 of the bottom frame 21b roll on the floor in a backward direction of the casing 2. Then, when a stopper of the other end portion of the rotation shaft 15 contacts the supporting portion 42, as shown in FIG. 3B, the rail portions 13 are accommodated in the rail portions 12, and an interval between the casing 2a and the casing 2b is shortened by a distance of the accommodation of the rail portion 13.

Further, when fitting the tip end of the rotation shaft of the tool into the tool receiving portion 16 of the rotation shaft 14 and rotating the rotation shaft 14 in the clockwise direction, the rotation shaft 14 is retracted to a back side of the supporting portion 41. At this time, the rail portions 12 are retracted into the rail portions 11, and at the top frame 22a and 22b side, the rail portions 12 are retracted into the rail portions 11. By and according to this movement, the wheels 23 of the bottom frame 21b roll on the floor in the backward direction of the casing 2. Then, when a stopper of the other end portion of the rotation shaft 14 contacts the supporting portion 41, as shown in FIGS. 3A and 4A, the rail portions 12 are accommodated in the rail portions 11, and the casing 2a and the casing 2b are connected or joined together.

Effect of Present Embodiment

As described above, the casing separation mechanism 1 is configured so that the rail portion 12 can be extended from the one end of the rail portion 11 by the rail movement mechanism, and also the rail portion 13 can be extended from the one end of the rail portion 12 by the rail movement mechanism. Therefore, the casing 2a and the casing 2b can be separated, thereby securing the maintenance space between the casing 2a and the casing 2b.

In particular, the supporting portion 41 provided at the parallel connecting member 31 is structured so that the rotation shaft 14 is screwed into the supporting portion 41. Then, by the rotation of the rotation shaft 14, it is possible to extend the rail portion 12 from the rail portion 11 and accommodate the rail portion 12 in the rail portion 11 while allowing to stop the rail portion 12 during the progress of movement of the rail portion 12. Further, the supporting portion 42 provided at the parallel connecting member 32 side is structured so that the supporting portion 42 supports the rotation shaft 14 and the rotation shaft 15 and the rotation shaft 15 is screwed into the supporting portion 42. Then, by the rotation of the rotation shaft 15, it is possible to extend the rail portion 13 from the rail portion 12 and accommodate the rail portion 13 in the rail portion 12 while allowing to stop the rail portion 13 during the progress of movement of the rail portion 13.

Hence, the other casing 2b can be stopped and settled at an arbitrary position during the progress of movement of the other casing 2b. It is therefore possible to secure an arbitrary space between the casing 2a and the casing 2b while ensuring safety during the movement of the casing 2b. As a consequence, even in the case where the electronic equipment is mounted in the casings 2a and 2b on a large scale, operator safety can be ensured when moving the casing 2b for the maintenance of the electronic equipment.

Further, the parallel connecting member 31 and the parallel connecting member 32 each have the rectangular plate shape. This can reinforce the rail portion 11 and the rail portion 13.

Furthermore, the supporting portion 42 is guided parallel to the pair of rail portions 13 by the guide portion 44. Therefore, a connecting accuracy of the one casing 2a with respect to the other casing 2b can be maintained.

Moreover, the rotation shaft 14 and the rotation shaft 15 are provided, at the front end portions thereof, with the tool receiving portions 16 and 17 respectively into which the one end portion of the rotation shaft of the tool for rotating the rotation shaft 14 and the rotation shaft 15 is fitted. Therefore, separating and connecting operations of the casing 2a and the casing 2b can be performed from the front side of the casing 2.

In addition, since the wheels 23 of the bottom frame 21b of the casing 2b can roll on the floor, the separating and connecting operations of the casing 2a and the casing 2b can be performed smoothly.

Second Embodiment

Figure 5A:
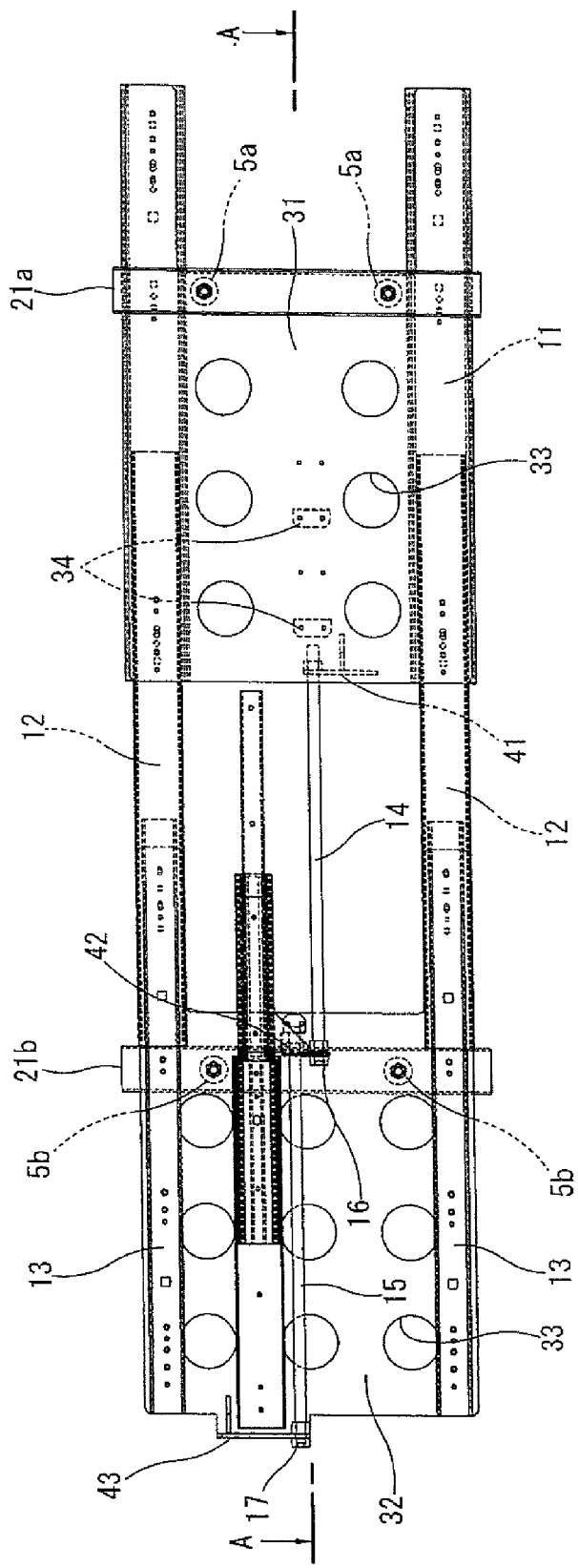
FIG. 5A is a plan view of a casing separation mechanism according to a second embodiment of the present invention.
Figure 5B:
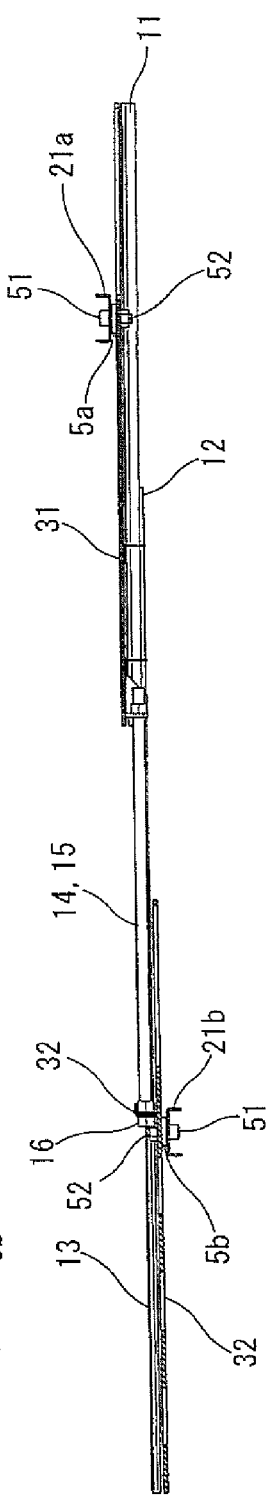
FIG. 5B is a sectional view taken along a line A-A of FIG. 5A.
Figure 6A:
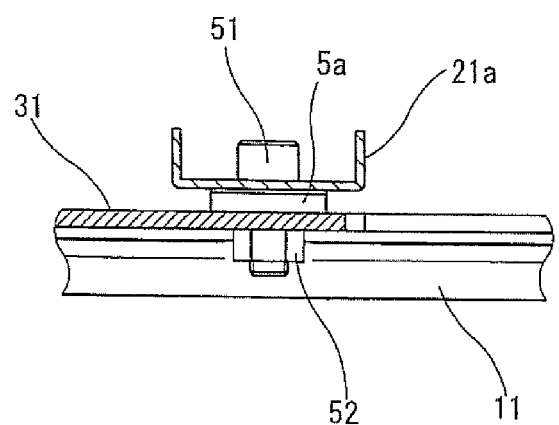
FIG. 6A is an enlarged sectional view showing an arrangement of a first tilt absorption member.
Figure 6B:
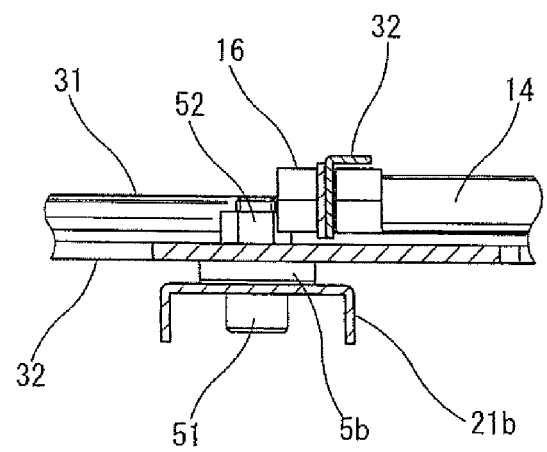
FIG. 6B is an enlarged sectional view showing an arrangement of a second tilt absorption member.

The casing separation mechanism 1 of the present invention shown in FIGS. 5 and 6 further has first tilt absorption members 5a that absorb tilt of the rail portion 11 with the first tilt absorption members 5a interposed between the bottom frame 21a of the one casing 2a and the rail portion 11. The casing separation mechanism 1 further has second tilt absorption members 5b that absorb tilt of the rail portion 13 with the second tilt absorption members 5b interposed between the bottom frame 21b of the other casing 2b and the rail portion 13.

The first tilt absorption member 5a is fixed with a bolt 51 and a nut 52 with the first tilt absorption member 5a interposed between the bottom frame 21a of the one casing 2a and the parallel connecting member 31. On the other hand, the second tilt absorption member 5b is fixed with a bolt 51 and a nut 52 with the second tilt absorption member 5b interposed between the bottom frame 21b of the other casing 2b and the parallel connecting member 32.

In a case where the casing separation mechanism 1 is set in the top frames 22a and 22b, the first tilt absorption members 5a are disposed between the top frame 22a of the one casing 2a and the rail portion 11. On the other hand, the second tilt absorption members 5b are disposed between the top frame 22b of the other casing 2b and the rail portion 13.

As the first tilt absorption member 5a and the second tilt absorption member 5b, a rubber washer (an elastic washer) which is made of EPDM, silicon rubber, urethane rubber etc. and a plate spring, a coil spring and a hinge which are made of steel, could be used.

According to the above casing separation mechanism 1, the tilt of the rail portion 11 and the tile of the rail portion 13 in the bottom frames 21a and 21b and the top frames 22a and 22b of the casings 2a and 2b are absorbed by the first tilt absorption member 5a and the second tilt absorption member 5b respectively.

Hence, according to the casing separation mechanism 1 of the present embodiment, in addition to the effects of the first embodiment, a greater stability can be ensured when moving the casing 2b. Further, with this structure, the separating and connecting operations of the casing 2a and the casing 2b can be performed smoothly in a more stable state without being affected by inclination or distortion (or warp) of the floor of the building.

Third Embodiment

The present invention is not limited to the above first and second embodiments. The present invention can be modified in accordance with, for instance, a locational condition of the casing 2 within scope of claim.

That is, as other aspects of the present invention, for instance, as will be described in the following aspect, the casing separation mechanism 1 of the first embodiment or the second embodiment is not provided with the rail portion 12 that is a third rail portion.

The casing separation mechanism 1 of the present embodiment has the pair of rail portions 11 which are arranged parallel to each other in the bottom frame 21a of the one casing 2a of the pair of casings 2 with the rail portions 11 overhanging from the bottom frame 21a, the pair of rail portions 13 which are set in the bottom frame 21b of the other casing 2b of the pair of casings 2 with the rail portions 13 overhanging from the bottom frame 21b and which are accommodated in the rail portions 11 so as to be able to extend from the one ends of the rail portions 11, and the rail movement mechanism which extends the rail portion 13 from the one end of the rail portion 11 and accommodates (or retracts) the rail portion 13 in (or into) the rail portion 11 so as to be able to stop the rail portion 13 during the progress of movement of the rail portion 13. This aspect is also an aspect of the present invention.

The rail movement mechanism has the parallel connecting member 32 that is set in the bottom frame 21b of the casing 2b and connects or fixes the pair of rail portions 13 parallel and the first drive mechanism that is provided at the parallel connecting member 32 and extends the rail portion 13 from the one end of the rail portion 11 and accommodates (or retracts) the rail portion 13 in (or into) the rail portion 11 so as to be able to stop the rail portion 13 during the progress of movement of the rail portion 13.

The first drive mechanism has the rotation shaft 15 which is disposed between the pair of rail portions 13, the supporting portion 42 into which the rotation shaft 15 is screwed and the supporting portion 43 which is provided at the portion on the front side of the parallel connecting member 32 and rotatably supports one end side of the rotation shaft 15.

Also in the present embodiment, the casing separation mechanism 1 is set in the top frames 22a and 22b of the casings 2a and 2b, and in the same manner as the first and second embodiments, the rail movement mechanism is not provided in the top frames 22a and 22b. Further, depending on a scale or sizes of the casings 2a and 2b, the rail movement mechanism is provided in either one or both of the top frames 22a and 22b and the bottom frames 21a and 21b.

It is obvious that the casing separation mechanism 1 of the third embodiment can obtain the same effects as those of the first embodiment and the second embodiment.

Industrial Applicability

The casing separation mechanism 1 of the present invention can be utilized for, for instance, a control switchboard for electric equipment, a control console or a control board for accommodating a computer, and the like.

EXPLANATION OF REFERENCE

1 . . . casing separation mechanism
2, 2a, 2b . . . casing
5a . . . first tilt absorption member, 5b . . . second tilt absorption member
11 . . . rail portion (first rail portion)
12 . . . rail portion (third rail portion)
13 . . . rail portion (second rail portion)
14 . . . rotation shaft (second rotation shaft), 16 . . . tool receiving portion
15 . . . rotation shaft (first rotation shaft), 17 . . . tool receiving portion
21a, 21b . . . bottom frame, 23 . . . wheel
22a, 22b . . . top frame
31 . . . parallel connecting member (second parallel connecting member), 41 . . . supporting portion (third supporting portion)
32 . . . parallel connecting member (first parallel connecting member), 42 . . . supporting portion (first supporting portion), 43 . . . supporting portion (second supporting portion), 44 . . . guide portion

The invention claimed is:

1. A casing separation mechanism of a pair of casings that accommodate therein electronic equipment, comprising:
   a pair of first rail portions which are arranged parallel to each other in a frame of a first casing of the pair of casings with the first rail portions overhanging from the frame of the first casing;
   a pair of second rail portions which are set in a frame of a second casing of the pair of casings with the second rail portions overhanging from the frame of the second casing;
   a pair of third rail portions accommodated in the first rail portions so as to be able to extend from one ends of the pair of first rail portions, wherein the second rail portions are accommodated in the third rail portions so as to be able to extend from one ends of the third rail portions;

a rail movement mechanism which extends the third rail portions from the one ends of the first rail portions and accommodates the third rail portions in the first rail portions so as to be able to stop the third rail portions during progress of movement of the third rail portions, and which extends the second rail portions from the one ends of the third rail portions and accommodates the second rail portions in the third rail portions so as to be able to stop the second rail portions during progress of movement of the second rail portions; and a guide portion;

wherein the rail movement mechanism comprises:
  a first parallel connecting member that is set in the frame of the second casing and connects the pair of second rail portions parallel to each other; and
  a first drive mechanism that is provided at the first parallel connecting member, extends the second rail portions from the one ends of the third rail portions and accommodates the second rail portions in the third rail portions so as to be able to stop the second rail portions during progress of movement of the second rail portions;
  wherein the first drive mechanism comprises:
    a first rotation shaft which is disposed between the pair of second rail portions;
    a first supporting portion into which the first rotation shaft is screwed; and
    a second supporting portion which is provided at a portion on a front side of the first parallel connecting member and rotatably supports the first rotation shaft; and
  wherein the guide portion guides the first supporting portion parallel to the pair of second rail portions.

2. The casing separation mechanism as claimed in claim 1, wherein:
  the rail movement mechanism has:
  a second parallel connecting member that connects the pair of first rail portions parallel to each other; and
  a second drive mechanism that is provided at the second parallel connecting member, extends the third rail portions from the one ends of the first rail portions and accommodates the third rail portions in the first rail portions so as to be able to stop the third rail portions during progress of movement of the third rail portions.

3. The casing separation mechanism as claimed in claim 1, wherein the frame of the second casing has wheels.

4. The casing separation mechanism as claimed in claim 1, wherein the casing separation mechanism is provided in at least one of a bottom frame or a top frame of the pair of casings.

5. The casing separation mechanism as claimed in claim 1, further comprising:
  a first tilt absorption member that absorbs tilt of the first rail portions with the first tilt absorption member interposed between the frame of the first casing and the first rail portions; and
  a second tilt absorption member that absorbs tilt of the second rail portions with the second tilt absorption member interposed between the frame of the second casing and the second rail portions.

6. The casing separation mechanism as claimed in claim 1, wherein the first rotation shaft is provided, at a front end portion thereof, with a tool receiving portion into which one end portion of a rotation shaft of a tool that rotates the first rotation shaft is fitted.

7. A casing separation mechanism of a pair of casings that accommodate therein electronic equipment, comprising:
  a pair of first rail portions which are arranged parallel to each other in a frame of a first casing of the pair of casings with the first rail portions overhanging from the frame of the first casing;
  a pair of second rail portions which are set in a frame of a second casing of the pair of casings with the second rail portions overhanging from the frame of the second casing;
  a pair of third rail portions accommodated in the first rail portions so as to be able to extend from one ends of the pair of first rail portions, wherein the second rail portions are accommodated in the third rail portions so as to be able to extend from one ends of the third rail portions; and
  a rail movement mechanism which extends the third rail portions from the one ends of the first rail portions and accommodates the third rail portions in the first rail portions so as to be able to stop the third rail portions during progress of movement of the third rail portions, and which extends the second rail portions from the one ends of the third rail portions and accommodates the second rail portions in the third rail portions so as to be able to stop the second rail portions during progress of movement of the second rail portions wherein:
  the rail movement mechanism has:
    a first parallel connecting member that is set in the frame of the second casing and connects the pair of second rail portions parallel to each other;
    a first drive mechanism that is provided at the first parallel connecting member, extends the second rail portions from the one ends of the third rail portions and accommodates the second rail portions in the third rail portions so as to be able to stop the second rail portions during progress of movement of the second rail portions;
    a second parallel connecting member that connects the pair of first rail portions parallel to each other; and
    a second drive mechanism that is provided at the second parallel connecting member, extends the third rail portions from the one ends of the first rail portions and accommodates the third rail portions in the first rail portions so as to be able to stop the third rail portions during progress of movement of the third rail portions;
  the first drive mechanism has:
    a first rotation shaft which is disposed between the pair of second rail portions;
    a first supporting portion into which the first rotation shaft is screwed; and
    a second supporting portion which is provided at a portion on a front side of the first parallel connecting member and rotatably supports the first rotation shaft and the second drive mechanism has:
    a second rotation shaft which is disposed between the pair of third rail portions and rotatably supported by the first supporting portion; and
    a third supporting portion which is provided at a portion on a front side of the second parallel connecting member and into which the second rotation shaft is screwed.

8. The casing separation mechanism as claimed in claim 7, further comprising:
a guide portion that guides the first supporting portion parallel to the pair of second rail portions.

9. The casing separation mechanism as claimed in claim 7, wherein the first rotation shaft is provided, at a front end portion thereof, with a tool receiving portion into which one end portion of a rotation shaft of a tool that rotates the first rotation shaft is fitted.

10. The casing separation mechanism as claimed in claim 7, further comprising a guide portion that guides the first supporting portion parallel to the pair of second rail portions.

11. A casing separation mechanism of a pair of casings that accommodate therein electronic equipment, comprising:
a pair of first rail portions which are arranged parallel to each other in a frame of a first casing of the pair of casings with the first rail portions overhanging from the frame of the first casing;
a pair of second rail portions which are set in a frame of a second casing of the pair of casings with the second rail portions overhanging from the frame of the second casing;
a pair of third rail portions accommodated in the first rail portions so as to be able to extend from one ends of the pair of first rail portions, wherein the second rail portions are accommodated in the third rail portions so as to be able to extend from one ends of the third rail portions; and
a rail movement mechanism which extends the third rail portions from the one ends of the first rail portions and accommodates the third rail portions in the first rail portions so as to be able to stop the third rail portions during progress of movement of the third rail portions, and which extends the second rail portions from the one ends of the third rail portions and accommodates the second rail portions in the third rail portions so as to be able to stop the second rail portions during progress of movement of the second rail portions wherein:
the rail movement mechanism comprises:
a first parallel connecting member that is set in the frame of the second casing and connects the pair of second rail portions parallel to each other; and
a first drive mechanism that is provided at the first parallel connecting member, extends the second rail portions from the one ends of the third rail portions and accommodates the second rail portions in the third rail portions so as to be able to stop the second rail portions during progress of movement of the second rail portions;
the first drive mechanism comprises:
a first rotation shaft which is disposed between the pair of second rail portions;
a first supporting portion into which the first rotation shaft is screwed; and
a second supporting portion which is provided at a portion on a front side of the first parallel connecting member and rotatably supports the first rotation shaft; and
at least one of the first rotation shaft or a second rotation shaft is provided, at a front end portion thereof, with a tool receiving portion into which one end portion of a rotation shaft of a tool that rotates at least the one of the first rotation shaft or the second rotation shaft is fitted.

12. The casing separation mechanism as claimed in claim 11, further comprising a guide portion that guides the first supporting portion parallel to the pair of second rail portions.

13. The casing separation mechanism as claimed in claim 11, wherein the rail movement mechanism further comprises:
a second parallel connecting member that connects the pair of first rail portions parallel to each other; and
a second drive mechanism that is provided at the second parallel connecting member, extends the third rail portions from the one ends of the first rail portions and accommodates the third rail portions in the first rail portions so as to be able to stop the third rail portions during progress of movement of the third rail portions.

* * * * *